(12) United States Patent
Jeong

(10) Patent No.: US 7,364,963 B2
(45) Date of Patent: Apr. 29, 2008

(54) METHOD FOR FABRICATING SEMICONDUCTOR DEVICE

(75) Inventor: Yong-Sik Jeong, Chungcheongbuk-do (KR)

(73) Assignee: MagnaChip Semiconductor, Ltd., Chungcheonbuk-do (KR)

( * ) Notice: Subject to any disclaimer, the term of this patent is extended or adjusted under 35 U.S.C. 154(b) by 197 days.

(21) Appl. No.: 11/400,341

(22) Filed: Apr. 6, 2006

(65) Prior Publication Data

US 2006/0228882 A1 Oct. 12, 2006

(30) Foreign Application Priority Data

Apr. 7, 2005 (KR) ............... 10-2005-0028882

(51) Int. Cl.
*H01L 21/8238* (2006.01)
(52) U.S. Cl. ............... 438/229; 438/225; 438/230; 438/265; 438/286; 438/303; 438/655
(58) Field of Classification Search ........ 438/229–238, 438/584, 597, 652, 655, 581, 583, 630, 649, 438/651, 664, 682; 257/E21.646, E21.645, 257/E21.662, E21.666
See application file for complete search history.

(56) References Cited

U.S. PATENT DOCUMENTS 5,854,109 A 12/1998 Sheng et al.

| | | | |
|---|---|---|---|
| 7,060,551 B2 * | 6/2006 | Huang | 438/218 |
| 7,094,655 B2 * | 8/2006 | Fukada et al. | 438/306 |
| 2001/0017800 A1 * | 8/2001 | Lee | 365/200 |
| 2003/0045059 A1 * | 3/2003 | Han | 438/275 |
| 2003/0087491 A1 * | 5/2003 | Jeong | 438/244 |

* cited by examiner

*Primary Examiner*—Kiesha Rose
*Assistant Examiner*—Daniel Whalen
(74) *Attorney, Agent, or Firm*—Blakely, Sokoloff, Taylor & Zafman LLP

(57) ABSTRACT

A method for fabricating a semiconductor device is provided. The method includes: implanting impurities onto a substrate by performing an ion implantation process; recessing portions of the substrate to form a plurality of trenches; performing a first thermal process to form junction regions between the trenches in the substrate by diffusing the impurities and simultaneously to form a gate oxide layer on the substrate and on the junction regions; forming a polysilicon layer on the gate oxide layer; sequentially etching the polysilicon layer and the gate oxide layer to form a gate structure, and to form first spacers on lateral walls of the junction regions; forming second spacers on lateral walls of the first spacers and the gate structure; and forming a metal silicide layer on top portions of the junction regions and the gate structure.

19 Claims, 20 Drawing Sheets

METHOD FOR FABRICATING SEMICONDUCTOR DEVICE

FIELD OF THE INVENTION

The present invention relates to a method for fabricating a semiconductor device; and, more particularly, to a method for fabricating a semiconductor device provided with a mask read-only memory (ROM) and a logic device in one chip.

DESCRIPTION OF RELATED ARTS

Recently, the usage of smart cards such as identification cards, credit cards and electronic cash are increasing. Herein, the smart card refers to a card with multiple functions. Usually, the smart card stores user information and transaction information, and appropriate programs are embedded in the smart card. Thus, a chip consisting of nonvolatile memory devices for writing/storing user information and the transaction information, mask ROMs for coding designated programs and logic devices is embedded in the smart card.

A mask ROM is a semiconductor memory device which preserves once programmed information in a cell even without power supply. Because important information requiring confidentiality such as a user's essential information are stored in the mask ROM, safety against hacking should be guaranteed. A method for programming the mask ROM includes selectively implanting impurities into either channel regions or polysilicon layers used as word lines of a desired cell transistor for coding during a fabrication process to change threshold voltage of the cell transistor.

A method for fabricating a conventional semiconductor device provided with a mask ROM and a logic device in one chip is described below in conjunction with FIGS. 1 to 4D. Herein, FIG. 1 is a top view illustrating a NOR-type mask ROM cell array, FIGS. 2A to 2C are cross-sectional views illustrating the NOR-type mask ROM cell array in FIG. 1 cut along perforated lines A to A' and B to B', FIGS. 3A to 3D are cross-sectional views illustrating the NOR-type mask ROM cell array in FIG. 1 cut along the perforated line A to A', and FIGS. 4A to 4D are cross-sectional views illustrating the NOR-type mask ROM cell array in FIG. 1 cut along the perforated line B to B'. Although a logic device region B is not illustrated in FIG. 1 for the convenience of description, the logic device region B is illustrated in FIGS. 2A to 2C through FIGS. 4A to 4D along with a cell region A.

As shown in FIGS. 1 and 2A, a semiconductor substrate 10 divided by a device isolation region 11 into a cell region A whereon a cell transistor is to be formed and a peripheral region B whereon a logic device transistor is to be formed is provided.

Subsequently, as shown in FIG. 2B, a mask process is performed on the substrate 10 to form a photoresist pattern 12 exposing predetermined portions of the substrate 10 in the cell region A. Then, junction regions 14 which function as source/drain regions of the cell transistor are formed in the cell region A through an ion implantation process. Herein, the junction regions 14 function as bit lines (BL) illustrated in FIG. 1.

Next, as shown in FIG. 2C, a strip process is performed on the above resulting substrate structure to remove the photoresist pattern 12, and then a gate oxide layer 15, a polysilicon layer 16, a tungsten silicide layer 17 (or a tungsten layer) and a capping layer 18 are sequentially formed over the substrate 10 where the photoresist pattern 12 had been removed. Herein, the polysilicon layer 16 is formed by employing a doped polysilicon layer doped with n-type impurities, and the capping layer 18 functions as a hard mask layer and/or an anti-reflected coating layer.

Furthermore, as shown in FIGS. 3A and 4A, the capping layer 18, the tungsten silicide layer 17, the polysilicon layer 16 and the gate oxide layer 15 are sequentially etched to form a gate structure of the logic device transistor in the peripheral region B and also form a plurality of word lines (WL) arranged with a certain spacing distance on the cell region A, as shown in FIG. 1.

Moreover, a lightly doped drain (LDD) ion implantation process, which is a low-concentration ion implantation process, is performed to form lowly doped junction regions 20A and 20B in the exposed portions of the substrate 10 in both sides next to the gate structure 19.

Subsequently, as shown in FIGS. 3B and 4B, an oxide layer, a nitride-based layer or a laminated layer of both is formed on the above resulting substrate structure including the lowly doped junction regions 20A and 20B. Then, an etch-back process is performed to form spacers 21A on lateral walls of the gate structure 19, as well as another spacer 21B on a lateral wall at the end of the word line (WL) on the cell region A.

Next, a source/drain ion implantation process, which is a high-concentration ion implantation process, is performed to form highly doped junction regions 22A and 22B above the lowly doped junction regions 20A and 20B exposed on both sides next to the spacers 21A. As a result, source/drain regions 23A and 23B are formed.

Furthermore, as shown in FIGS. 3C and 4C, a silicide barrier layer 24 is formed over the capping layer 18 in the cell region A. Herein, the silicide barrier layer 24 is formed by employing one of an oxide layer, a nitride-based layer and a laminated layer of both.

Moreover, a metal layer is formed over the entire surface of the above resulting substrate structure including the silicide barrier layer 24, and then a thermal process is performed to form a metal silicide layer 25 only on the source/drain regions 23A and 23B in the peripheral region B. After the thermal process, portions of the metal layer which did not react are removed.

At this point, the metal silicide layer 25 is not formed in the cell region A because of the silicide barrier layer 24. Naturally, the metal silicide layer 25 is not formed on the gate structure 19 either, because the capping layer 18 formed on top of the gate structure 19 did not react with the metal layer.

Subsequently, as shown in FIGS. 3D and 4D, an interlayer insulation layer 26 is formed over the entire surface of the above resulting substrate structure, and then a metal wiring process is performed to complete the device formation.

In the above conventional method, the metal silicide layer is not formed on the cell region A, providing an advantage of preventing electrical short-circuits between the bit lines (BL) irrespective of highly integrated devices. However, because the metal silicide layer is not formed in the cell region A, contact resistance of the word lines (WL) and the bit lines (BL) increases. Thus, limitations such as deteriorated device characteristics, unrealizable high-speed operations and decreased degree of integration may arise. Also, when forming the metal silicide layer in the peripheral region only, it is difficult to apply a dual poly structure, resulting in a decreased P-channel metal-oxide-semiconductor (PMOS) characteristic of the logic circuit.

To overcome such limitations, a semiconductor device fabrication method wherein the metal silicide layer is formed in the cell region as well as in the peripheral region is proposed. One example of such method is a self aligned silicide (SALICIDE) process. A method for fabricating a semiconductor device with the SALICIDE process is described hereinafter.

FIG. 5 is a cross-sectional view illustrating an NOR-type mask ROM cell array in FIG. 1 cut along the perforated lines A to A', and FIG. 6 is a cross-sectional view illustrating the NOR-type mask ROM cell array in FIG. 1 cut along the perforated line B to B'.

As shown in FIGS. 5 and 6, a metal silicide layer 125A or 125B is formed not only on a polysilicon layer 116 in the cell region A, but on a gate structure 119 in the peripheral region B to reduce increasing contact resistance caused by highly integrated devices. Herein, the metal silicide layers 125B and 125A denote the metal silicide layer formed in the cell region A and the peripheral region B, respectively. Also, the metal silicide layers 125A and 125B are formed by employing a SALICIDE process.

The SALICIDE process includes: forming junction regions 114 and source/drain regions 123A and 123B in a substrate 110 divided by a device isolation region 111 into the cell region A and the peripheral region B; forming the gate structure 119 and spacers 121A and 121B on the above resulting substrate structure; forming a metal layer over the above resulting substrate structure; performing a thermal process to form metal silicide layers 125A and 125B; and removing portions of the metal layer which did not react.

In the peripheral region B, the metal silicide layer 125A is formed by a reaction between the polysilicon layer 116 of the gate structure 119 and the metal layer, and also self-aligned and formed by a reaction between the source/drain regions 123A and 123B and the metal layer. Also in the cell region A, the metal silicide layer 125B is formed on top of word lines (WL) by a reaction between the polysilicon layer 116, which serves as the word lines (WL), and the metal layer, and also self-aligned and formed over bit lines (BL) by a reaction between the source/drain region junction regions 114 which function as the bit lines (BL) and the metal layer.

In the above conventional method, it is possible to reduce contact resistance of the word lines (WL) and the bit lines (BL) by forming the metal silicide layer 125B in the cell region. However, as devices become highly integrated, there arise limitations such as electrical short-circuits of the bit lines (BL) 114 by the metal silicide layer 125B as shown in 'A' of FIG. 6.

To overcome the limitations of the latter described conventional method, another method for fabricating a semiconductor device wherein the metal silicide layer is formed only on the word lines (WL) in the cell region is provided below.

FIGS. 7A to 7G are cross-sectional views illustrating FIG. 1 cut along the perforated line A to A', and FIG. 8 is a cross-sectional view illustrating FIG. 1 cut along the perforated line B to B'.

As shown in FIG. 7A, a semiconductor substrate 210 divided by a device isolation region 211 into a cell region A whereon a cell transistor is to be formed and a peripheral region B whereon a logic device transistor is to be formed is provided.

Subsequently, as shown in 7B, a gate oxide layer 212 and a first polysilicon layer 213 are formed on the semiconductor substrate 210, and then a photoresist pattern 214 is formed over the above resulting substrate structure 210 by performing a mask process. Herein, the photoresist pattern 214 is formed with openings in the cell region A, wherein the openings are formed above portions predetermined for forming junction regions 216 to serve as source/drain regions.

Next, the first polysilicon layer 213 is etched by an etching process using the photoresist pattern 214 as an etch mask to expose portions of the gate oxide layer 212. Then, a source/drain ion implantation process 215, which is a high-concentration ion implantation process, is performed to form a plurality of junction regions 216 in the predetermined portions of the substrate 210 in the cell region A.

As shown in FIG. 7C, a strip process is performed to remove the photoresist pattern 214, and then a second polysilicon layer 217 is formed over the entire surface of the above resulting substrate structure.

As shown in FIG. 7D, the second polysilicon layer 217 is etched to form a plurality of word lines (WL) in the cell region A, and to form a gate structure 218 in the peripheral region B. Herein, the gate structure 218 includes the gate oxide layer 212, the first polysilicon layer 213 and the second polysilicon layer 217.

Referring to FIG. 7E, an LDD ion implantation process, which is a low-concentration ion implantation process, is performed on the above resulting substrate structure to form lowly doped junction regions 219A and 219B in the exposed portions of the substrate 210 in both sides next to the gate structure 218.

Then, an oxide layer, a nitride-based layer or a laminated layer of both is formed on the surface of the above resulting substrate structure, and then an etch-back process is performed to form spacers 220A on lateral walls of the gate structure 218, as well as another spacer 220B on a lateral wall at the end of the word lines (WL).

Furthermore, a source/drain ion implantation process, which is a high-concentration ion implantation process, is performed to form highly doped junction regions 221A and 221B in the lowly doped junction regions 219A and 219B exposed on both sides next to the spacers 220A. Thus, source/drain regions 222A and 222B are formed.

Next, as shown in FIG. 7F, a metal layer is formed over the entire surface of the above resulting substrate structure illustrated in FIG. 7E, then a thermal process is performed to form a metal silicide layer 223B over the second polysilicon layer 217 for the word lines (WL) and the junction regions 216, and to form another metal silicide layer 223A over the gate structure 218. Then, all portions of the metal layer which did not react are removed. Referring to FIG. 7G and FIG. 8, an inter-layer insulation layer 224 is formed over the entire surface of the above resulting substrate structure illustrated in FIG. 7F, and then a metal wiring process is proceeded to complete the device formation.

As described above, the gate oxide layer 212 functions as a silicide barrier layer in the metal silicide layer formation process, and thus, preventing electrical short-circuits between bit lines (BL) as shown in FIG. 8. However, as shown in FIG. 7D, it may be a difficult process to have the gate oxide layer 212 to remain on the substrate 210 while etching the second polysilicon layer 217. Even if the gate oxide layer 212 is not etched and remains on the substrate 210, the thickness of the gate oxide layer 212 (approximately 20 Å to 50 Å) is too thin to function as a silicide barrier layer. Also, if the gate oxide layer 212 remains as the silicide barrier layer, the oxide layer 212 exists in the cell region A as well as in the peripheral region B. Hence, it is possible to prevent the metal silicide layer from forming on the source/drain regions 222A and 222B as shown in FIG. 7G and FIG. 8. The bit lines (BL) formed in the cell region A are isolated, and therefore, the bit lines (BL) are generally not affected very much by the metal silicide layer formation.

Accordingly, it is generally required to have the metal silicide layer formed on the word lines (WL) only. However, it is advantageous to a device characteristic, to have the metal silicide layer formed entirely on the peripheral region B except for the field regions.

SUMMARY OF THE INVENTION

It is, therefore, an object of the present invention to provide a method for fabricating a semiconductor device capable of preventing electrical short-circuits between bit lines (source/drain regions) and stably forming a metal silicide layer on the bit lines and word lines, without forming a silicide barrier layer.

Furthermore, another object of the present invention is to provide a method for fabricating a semiconductor device capable of simplifying the whole process and stably forming a metal silicide layer on an entire region of a chip (that are the word lines, the bit lines, a gate structure and the source/drain regions) including a cell region and a logic device region (also referred to as a peripheral region).

Moreover, still another object of the present invention is to provide a method for fabricating a semiconductor device capable of preventing channel length reduction caused by lateral diffusion of the source/drain regions.

In accordance with an aspect of the present invention, there is provided a method for fabricating a semiconductor device, including: implanting impurities onto a substrate by performing an ion implantation process; recessing portions of the substrate to form a plurality of trenches; performing a first thermal process to form junction regions between the trenches in the substrate by diffusing the impurities and simultaneously to form a gate oxide layer on the substrate and on the junction regions; forming a polysilicon layer on the gate oxide layer; sequentially etching the polysilicon layer and the gate oxide layer to form a gate structure, and to form first spacers on lateral walls of the junction regions; forming second spacers on lateral walls of the first spacers and the gate structure; and forming a metal silicide layer on top portions of the junction regions and the gate structure.

In accordance with another aspect of the present invention, there is provided a method for fabricating a semiconductor device, including: preparing a substrate defined into a first region whereon a cell transistor is to be formed and a second region whereon a logic transistor is to be formed; implanting impurities onto the substrate in the first region by performing a first ion implantation process; recessing portions of the substrate in the first region to form a plurality of trenches; performing a thermal process to form bit lines between the plurality of trenches, and to form a gate oxide layer on the bit lines and the substrate; forming a polysilicon layer on the gate oxide layer; sequentially etching the polysilicon layer and the gate oxide layer to form word lines that cross the bit lines in the first region, to form a gate structure in the second region, and to form first spacers on both lateral walls of the bit lines; forming second spacers on the lateral walls of the first spacers and the gate structure; forming source/drain regions on exposed portions of the substrate surface on both sides of the gate structure by performing a second ion implantation process; and forming a metal silicide layer on the word lines, the bit lines, the gate structure and the source/drain regions.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

A method for fabricating a semiconductor device in accordance with a specific embodiment of the present invention will be described in detail with reference to the accompanying drawings.

Figure 1:
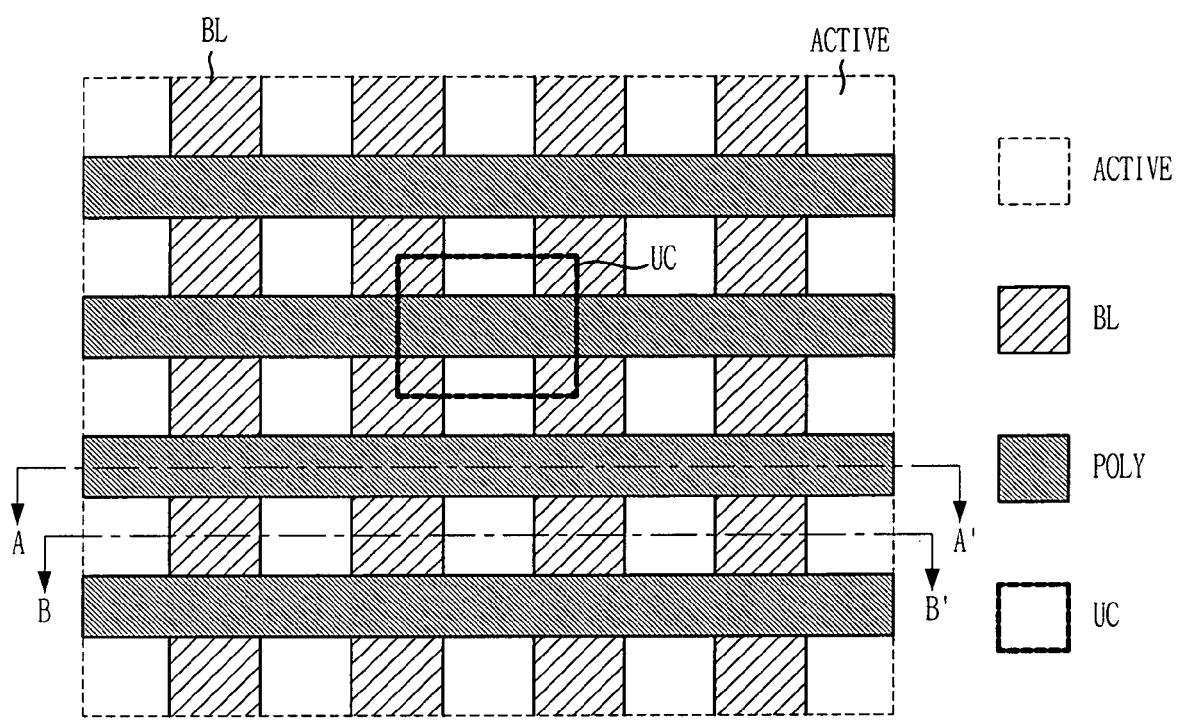
FIG. 1 is a top view illustrating a conventional semiconductor device.
Figure 2A:
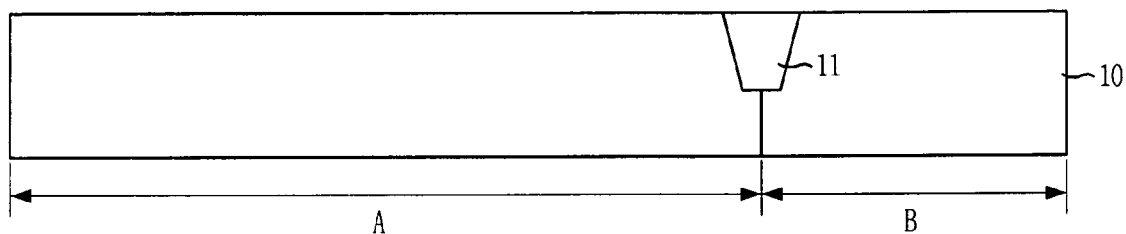
FIGS. 2A and 2C are cross-sectional views illustrating the conventional semiconductor device in FIG. 1 cut along perforated lines A to A' and B to B'.
Figure 2B:
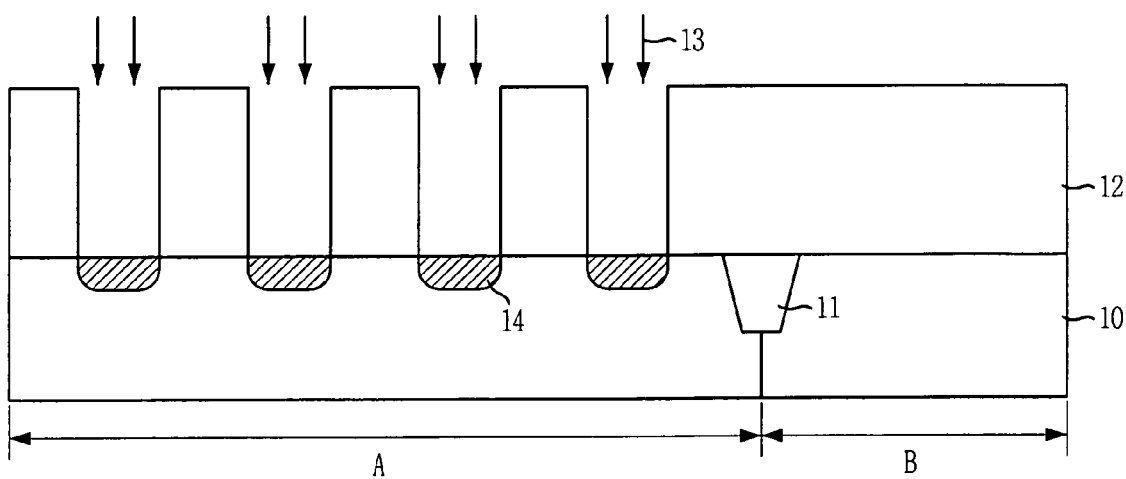
Figure 2C:
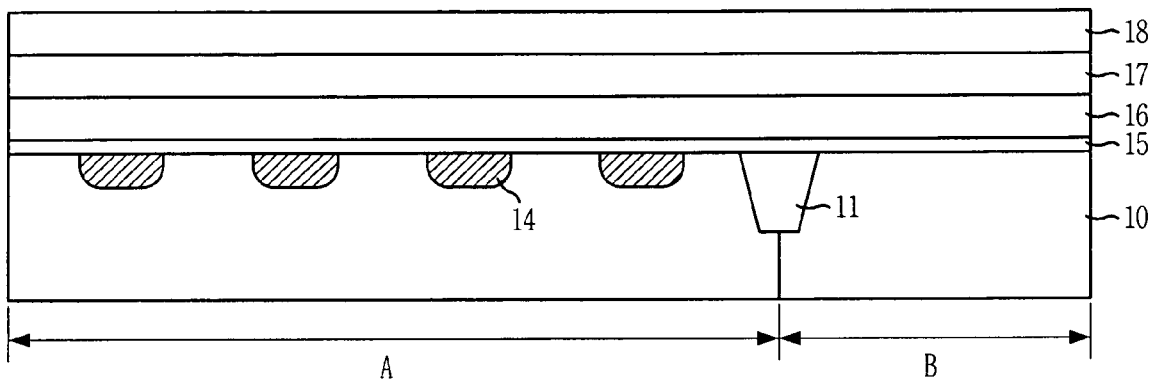
Figure 3A:
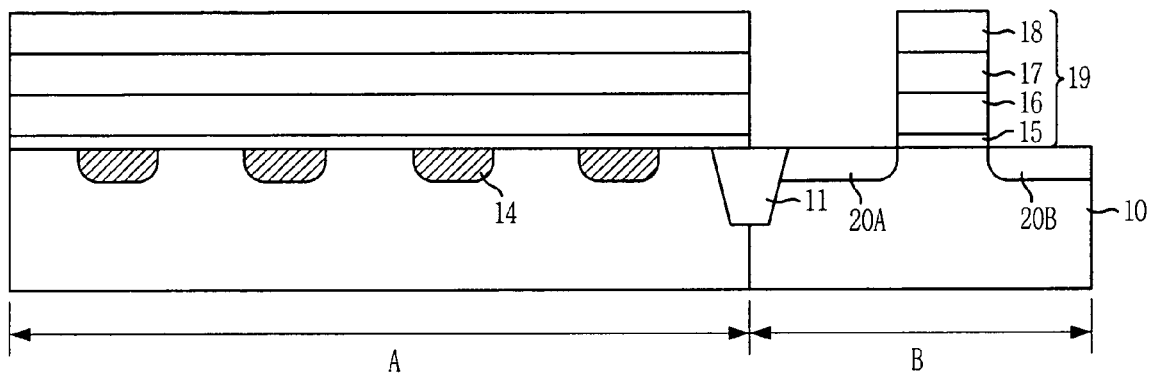
FIGS. 3A to 3D are cross-sectional views illustrating the conventional semiconductor device in FIG. 1 cut along the perforated line A to A'.
Figure 3B:
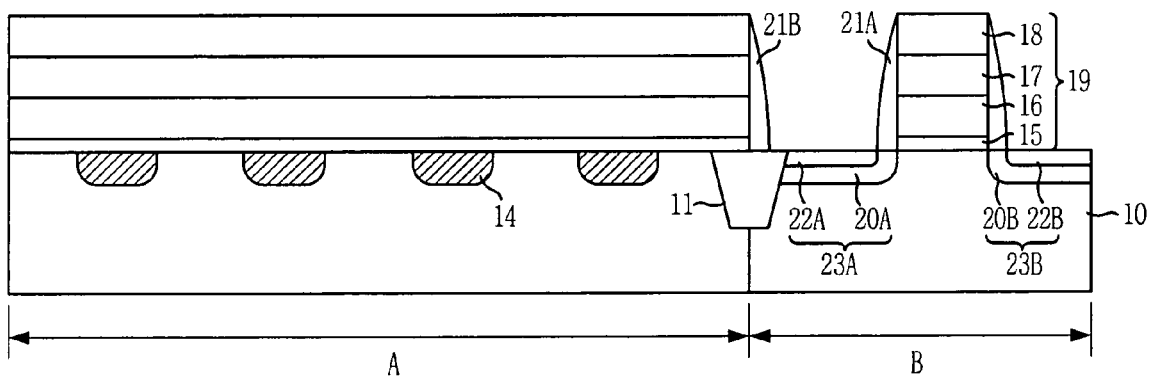
Figure 3C:
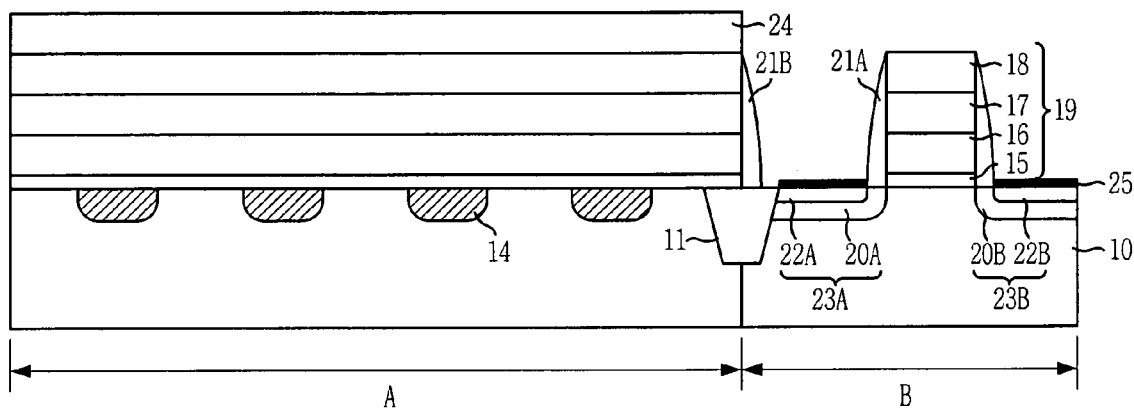
Figure 3D:
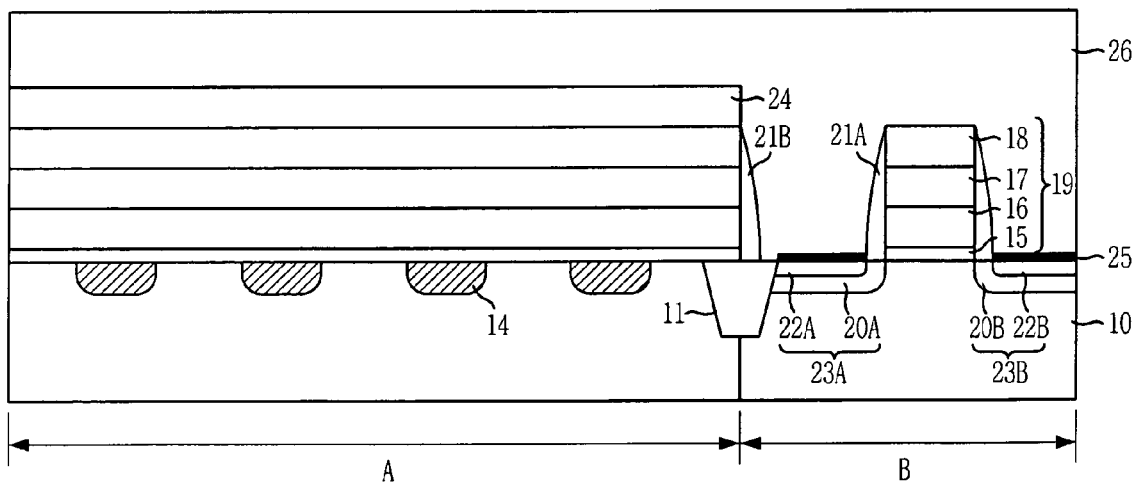
Figure 4A:
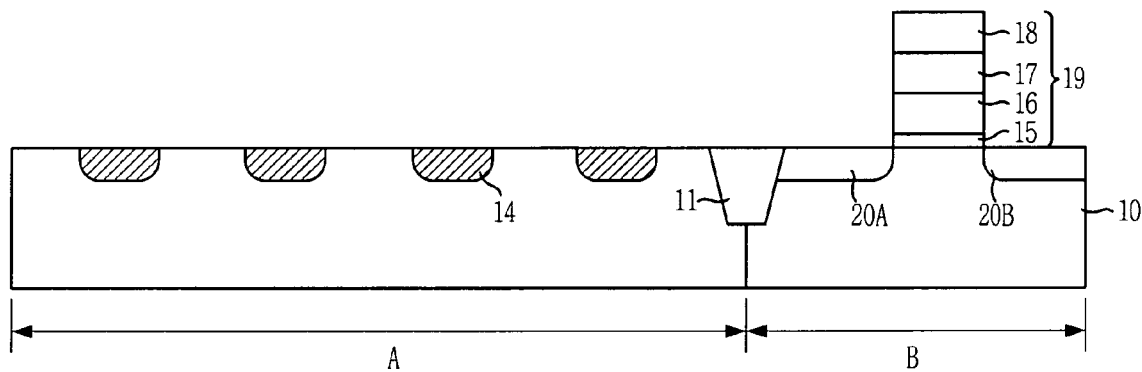
FIGS. 4A to 4D are cross-sectional views illustrating the conventional semiconductor device in FIG. 1 cut along the perforated line B to B'.
Figure 4B:
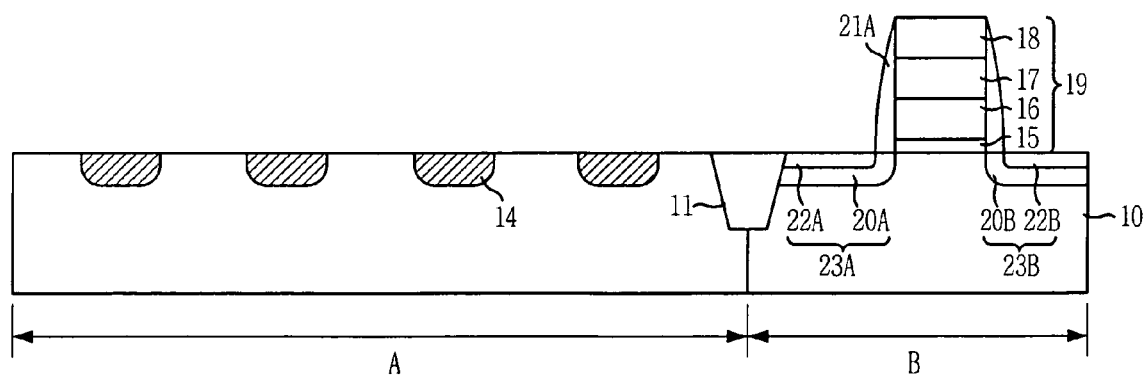
Figure 4C:
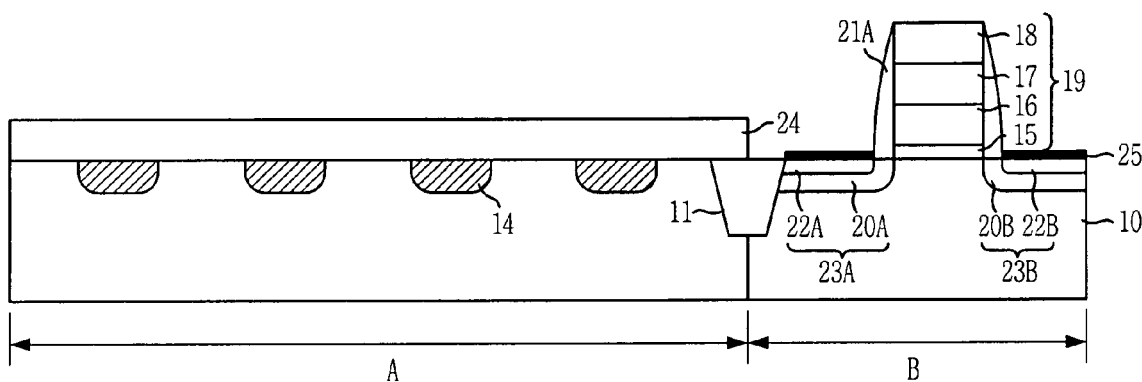
Figure 4D:
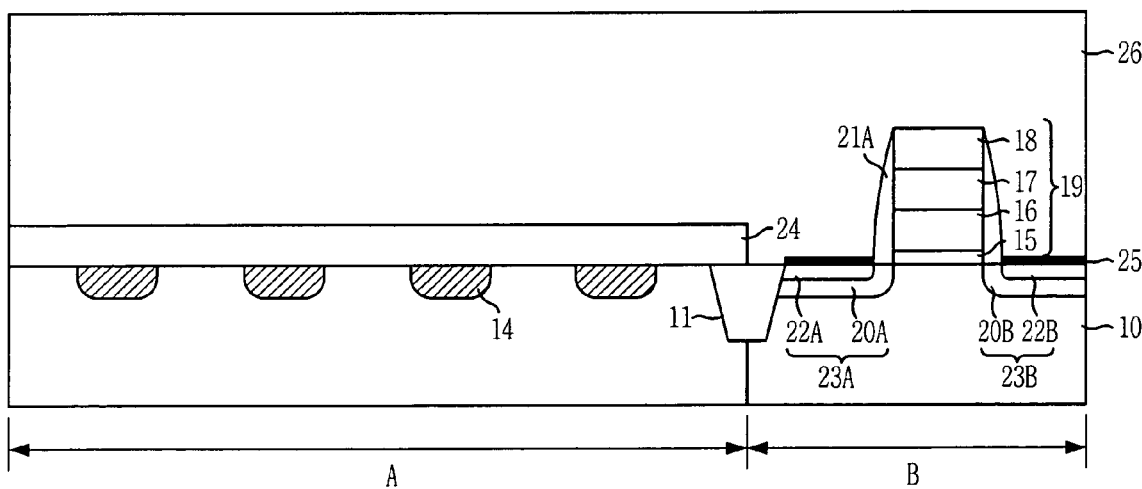
Figure 5:
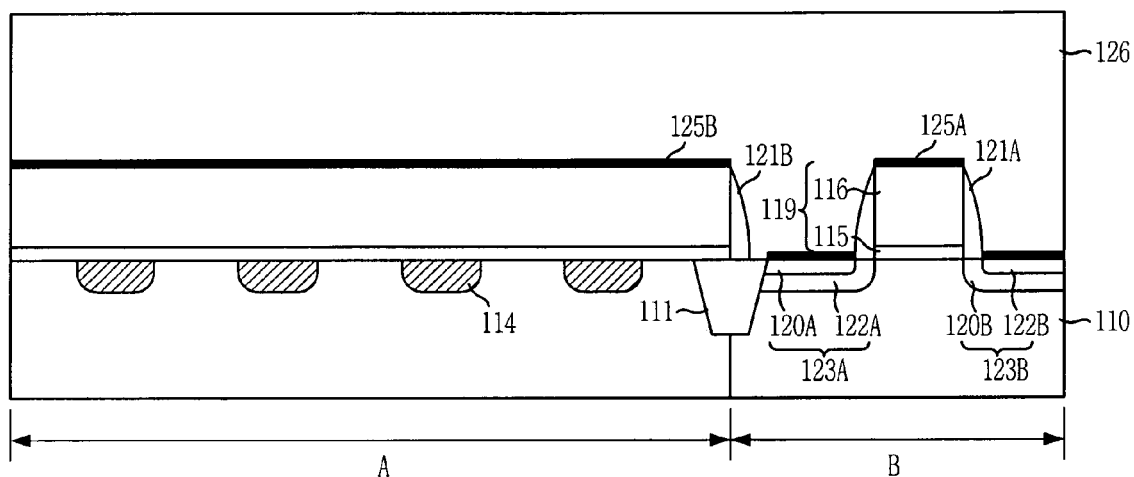
FIGS. 5 and 6 are cross-sectional views illustrating the conventional semiconductor device in FIG. 1 cut along perforated lines A to A' and B to B'.
Figure 6:
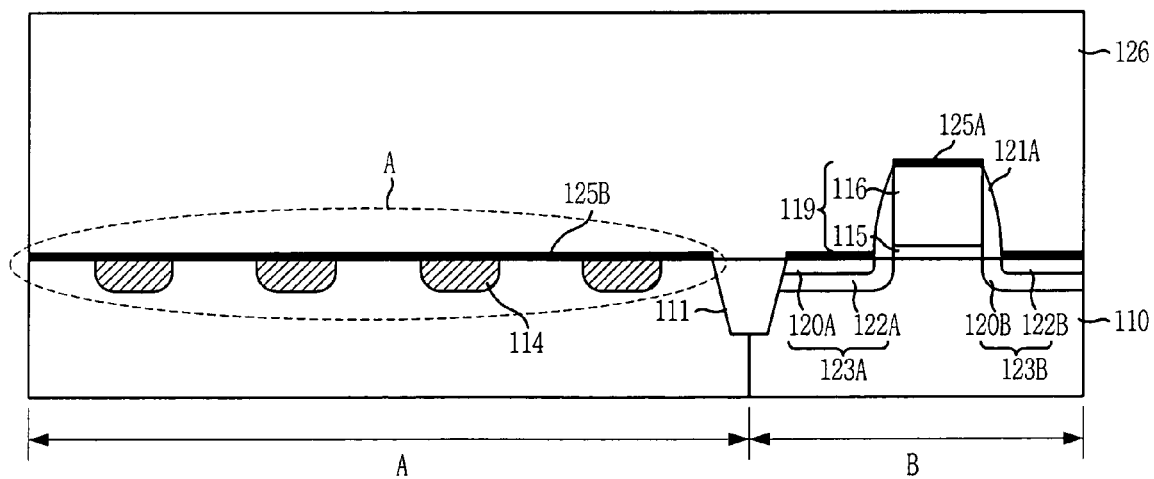
Figure 7A:
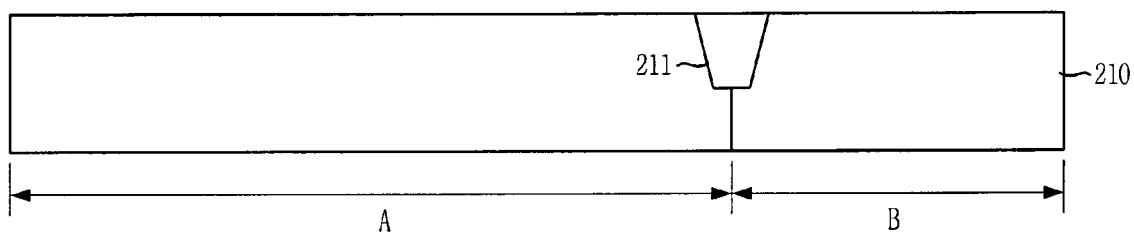
FIGS. 7A to 7G are cross-sectional views illustrating the conventional semiconductor device in FIG. 1 cut along the perforated line A to A'.
Figure 7B:
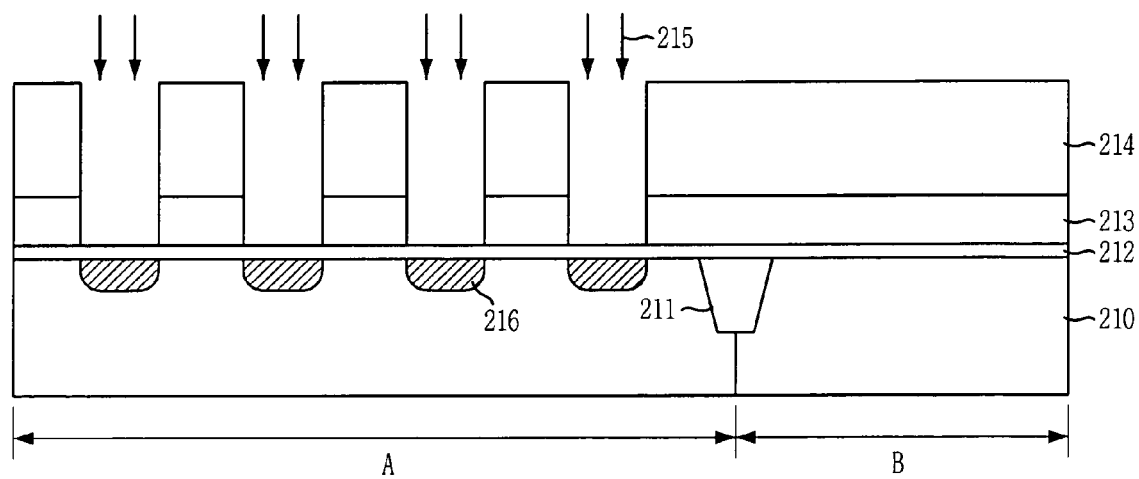
Figure 7C:
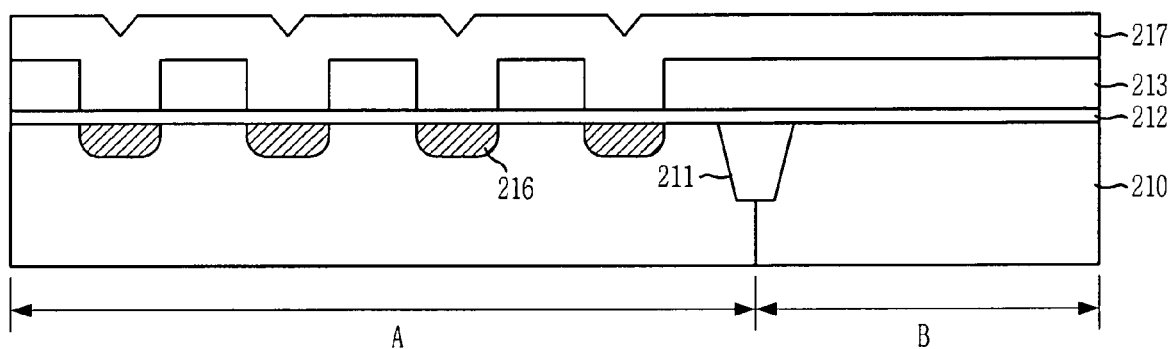
Figure 7D:
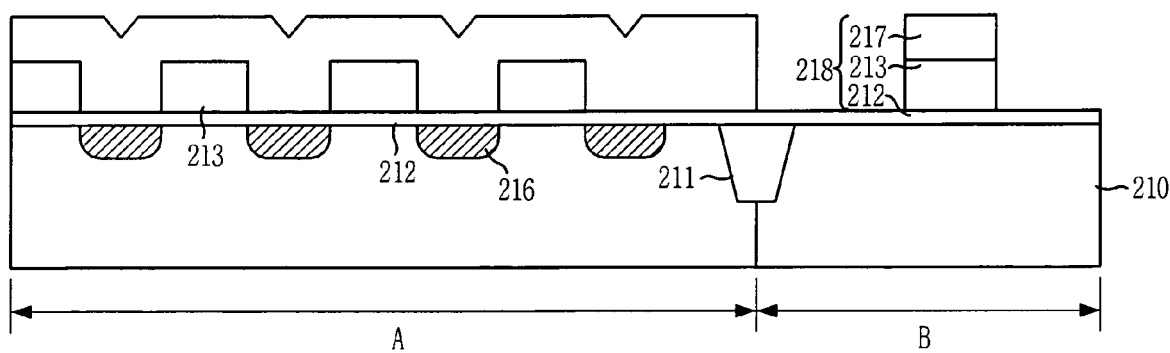
Figure 7E:
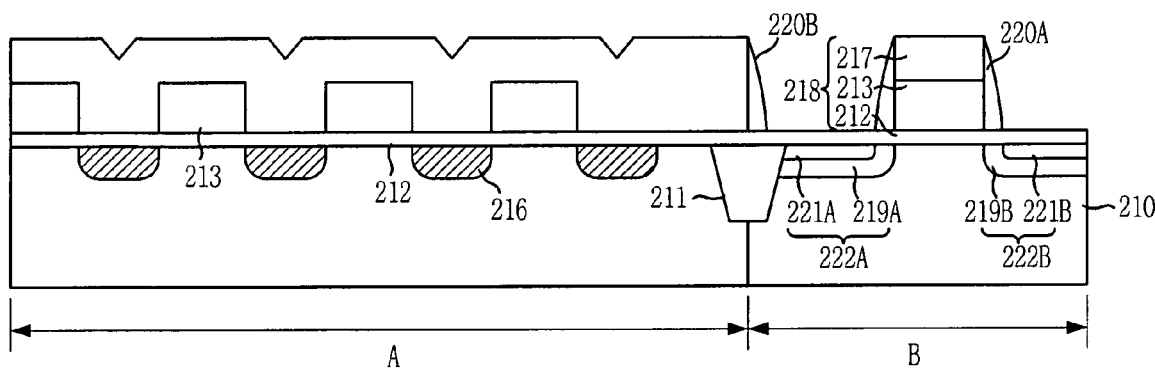
Figure 7F:
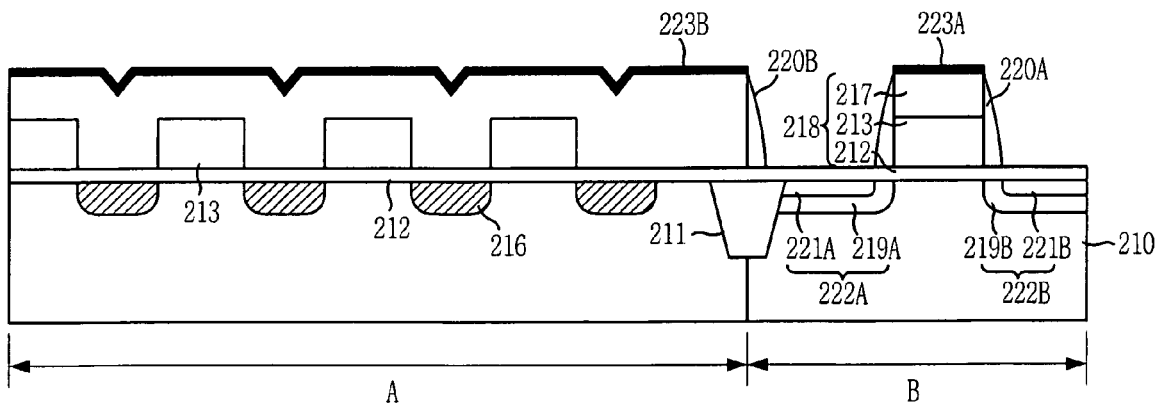
Figure 7G:
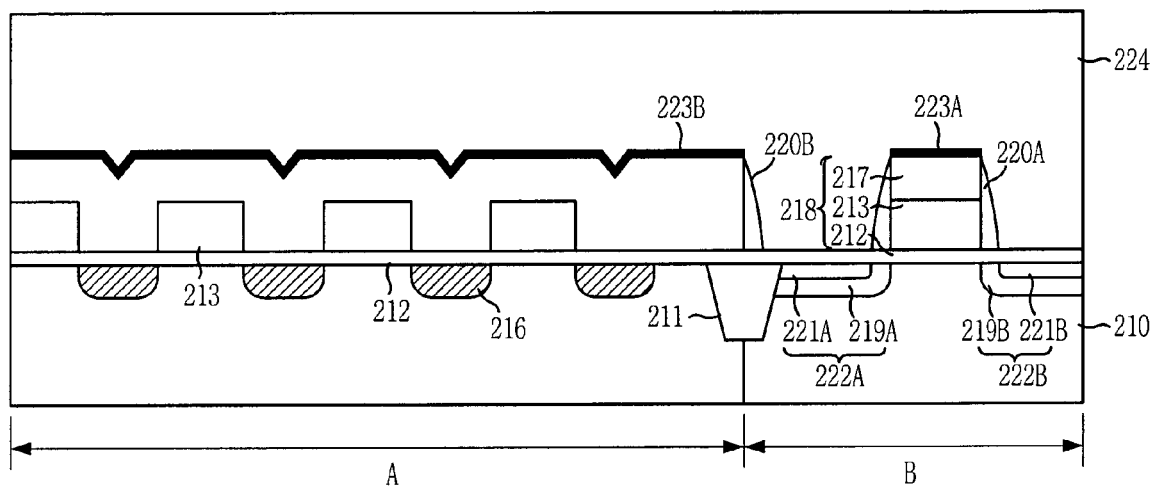
Figure 8:
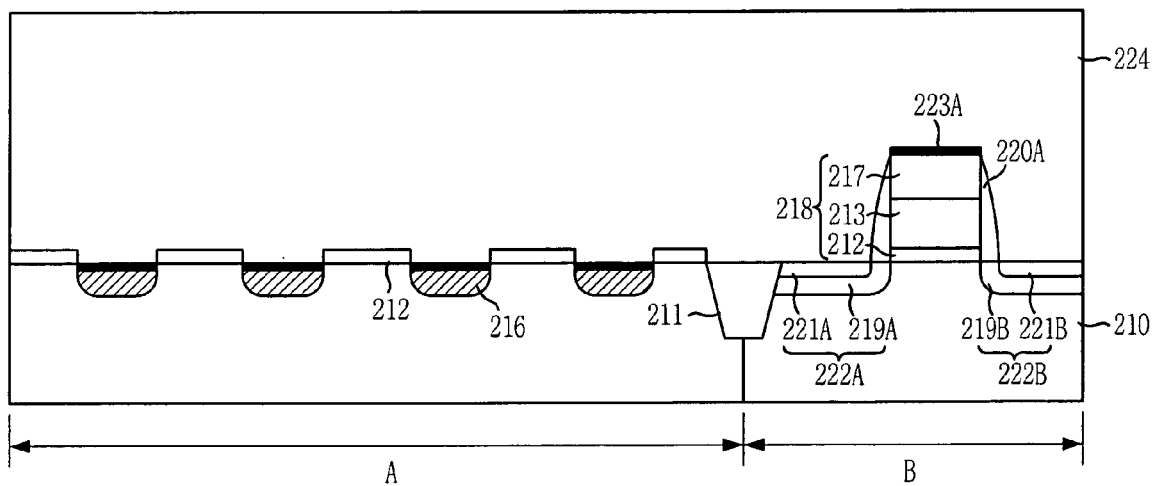
FIG. 8 is a cross-sectional view illustrating the conventional semiconductor device in FIG. 1 cut along the perforated line B to B'.
Figure 9:
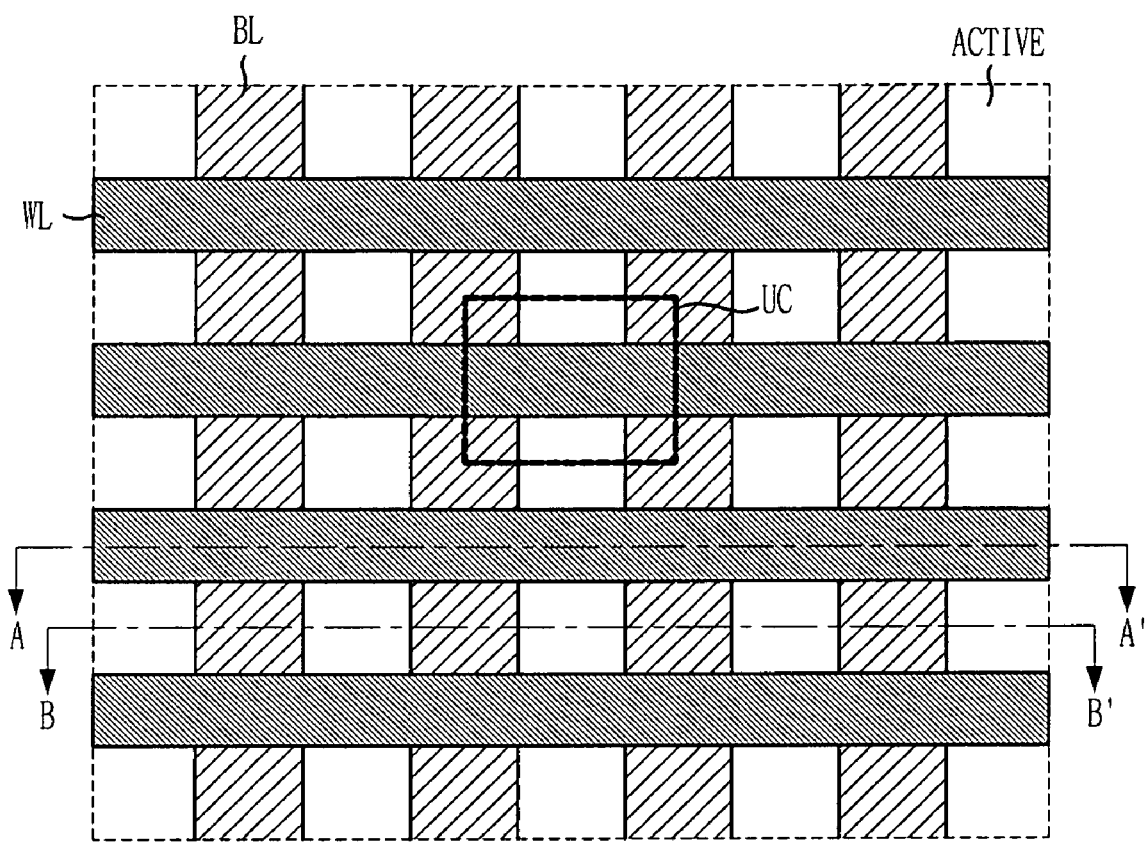
FIG. 9 is a top view illustrating a semiconductor device in accordance with a specific embodiment of the present invention.
Figure 10A:
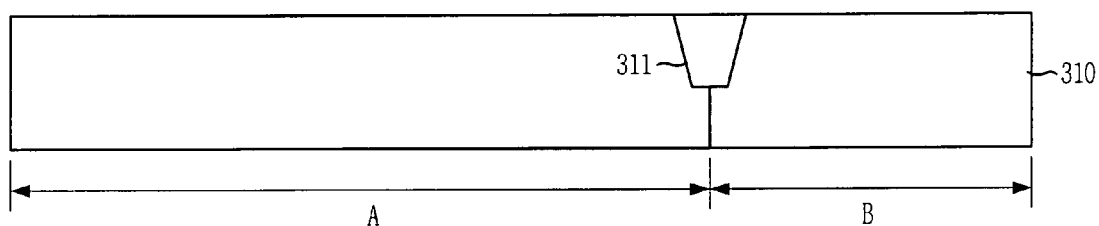
FIGS. 10A to 10E are cross-sectional views illustrating the semiconductor device in FIG. 9 cut along perforated lines A to A' and B to B'.
Figure 10B:
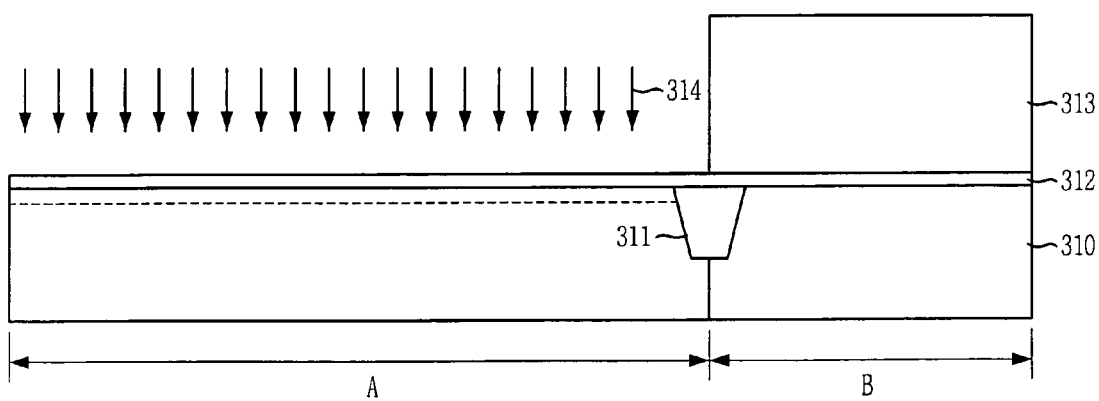
Figure 10C:
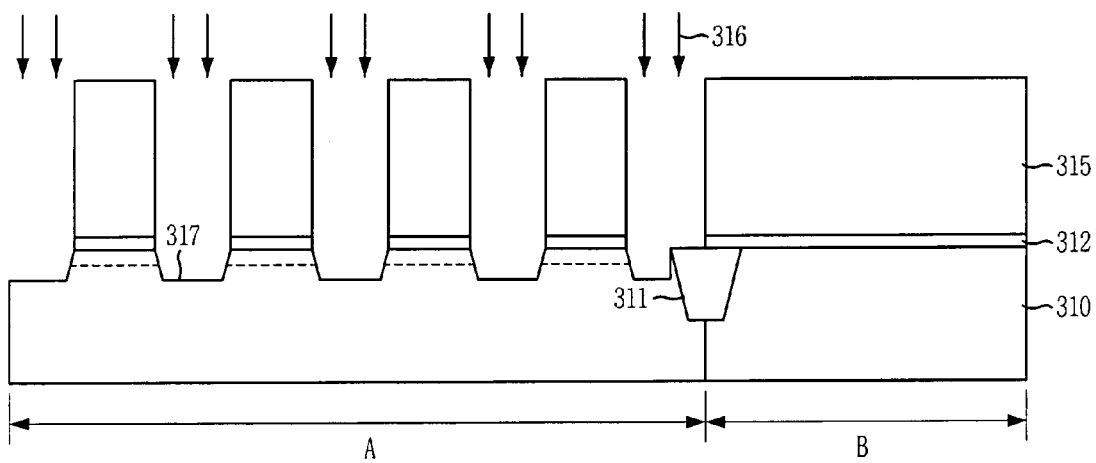
Figure 10D:
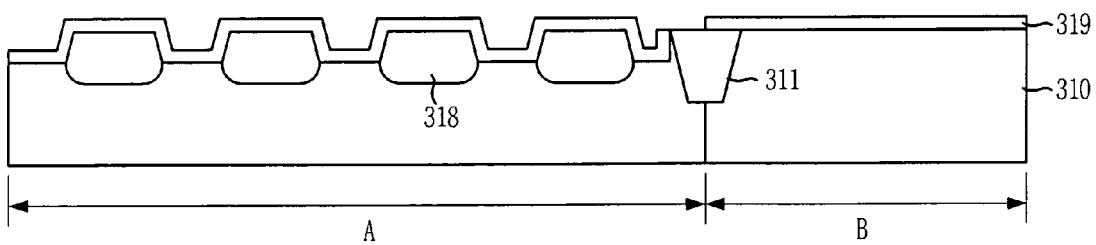
Figure 10E:
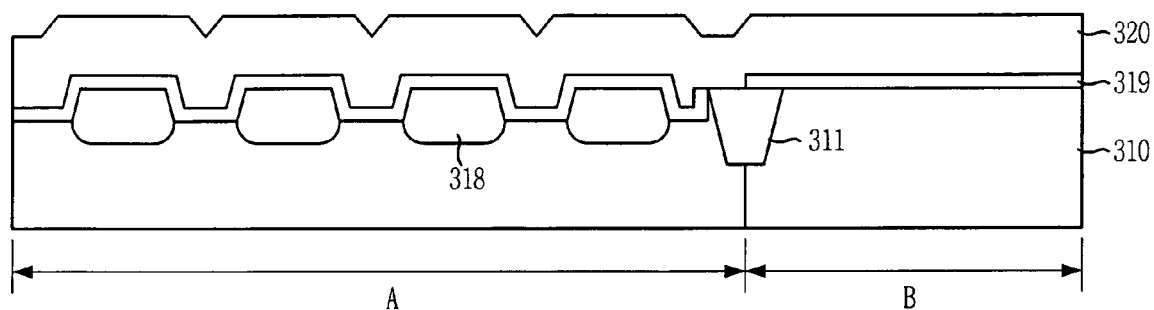
Figure 11A:
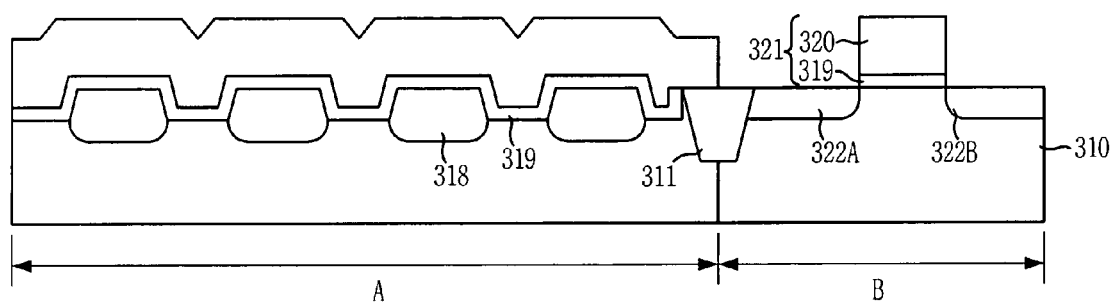
FIGS. 11A to 11C are cross-sectional views illustrating the semiconductor device in FIG. 9 cut along the perforated line A to A'.
Figure 11B:
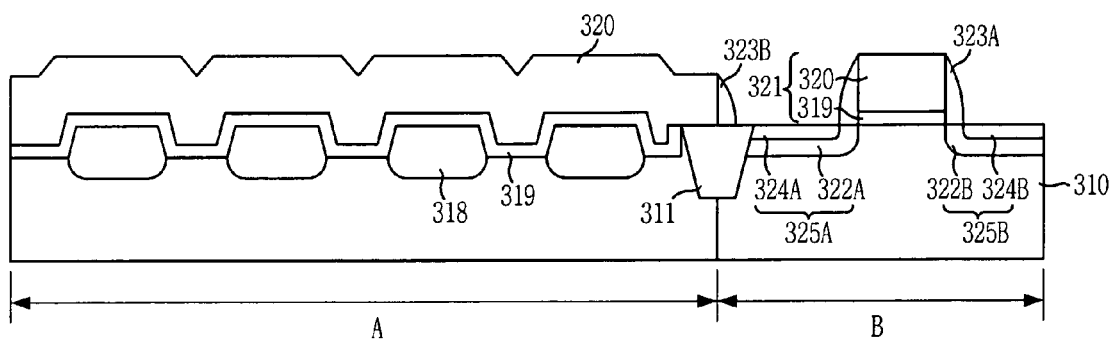
Figure 11C:
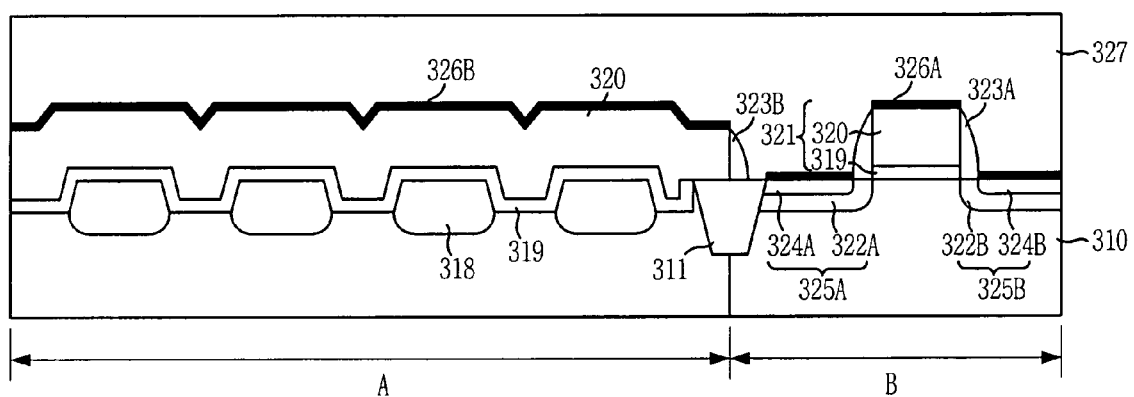
Figure 12A:
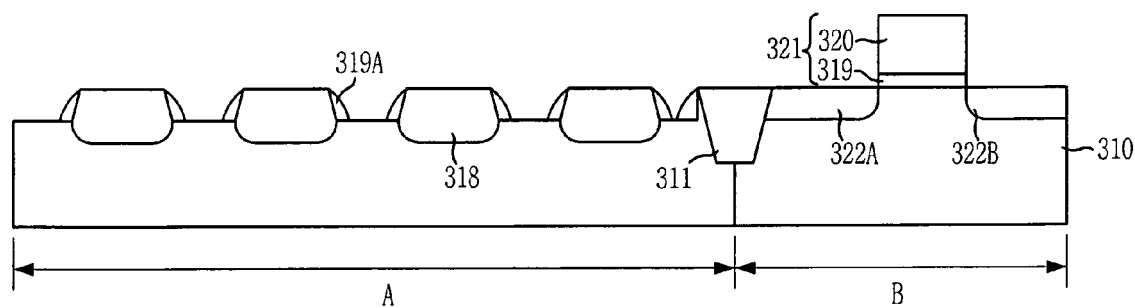
FIGS. 12A to 12C are cross-sectional views illustrating the semiconductor device in FIG. 9 cut along the perforated line B to B'.
Figure 12B:
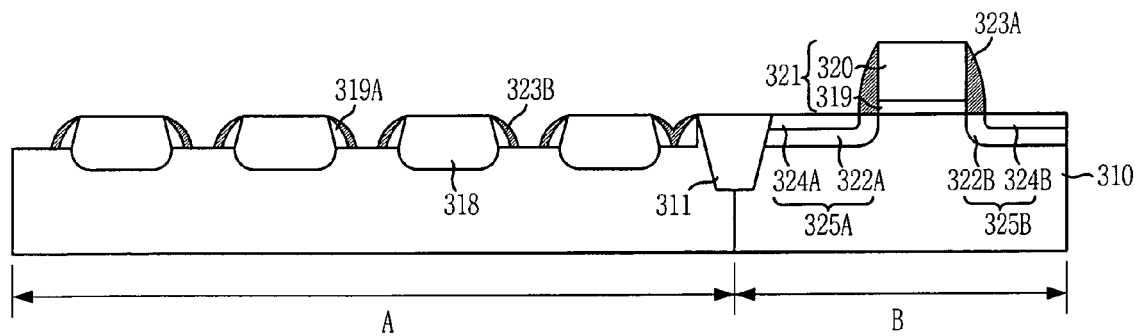
Figure 12C:
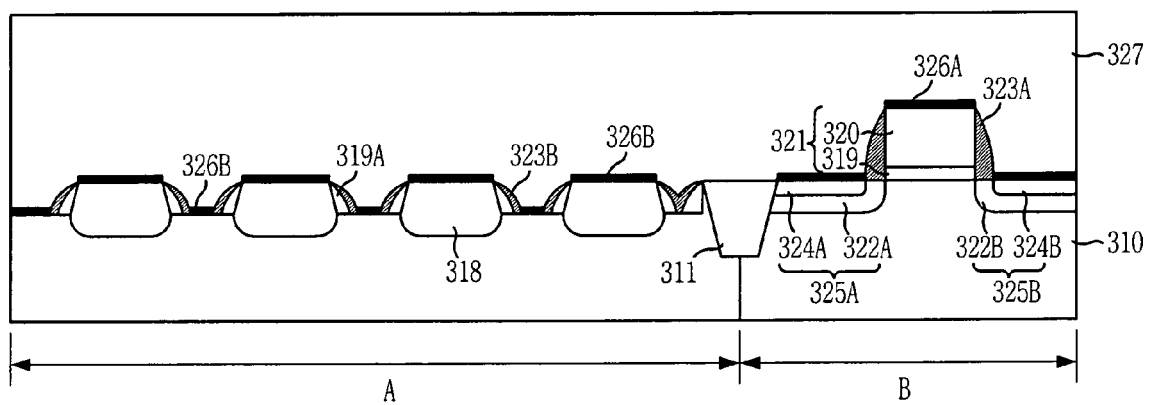

FIG. 9 is a top view illustrating a NOR-type mask ROM cell array to describe a method for fabricating a semiconductor device in accordance with a specific embodiment of the present invention, FIGS. 10A to 10E are cross-sectional views illustrating the NOR-type mask ROM cell array in FIG. 9 cut along perforated lines A to A' or B to B', FIGS. 11A to 11C are cross-sectional views illustrating the NOR-type mask ROM cell array in FIG. 9 cut along the perforated line A to A', and FIGS. 12A to 12C are cross sectional views illustrating the NOR-type mask ROM cell array in FIG. 9 cut along the perforated line B to B'. While a logic device region B is not illustrated in FIG. 9, the logic device region B is illustrated in FIGS. 10A to 10E through 12A to 12C along with a cell region A.

As shown in FIGS. 9 and 10A, a semiconductor substrate 310 divided by a device isolation region 311 into the cell region A whereon a cell transistor is to be formed and a peripheral region B whereon a logic device transistor is to be formed is provided. At this time, the device isolation region 311 is formed by employing one of a local oxidation of silicon (LOCOS) process, a modified LOCOS process and a shallow trench isolation (STI) process. Herein, the STI process is applied to a sub-quarter micron device.

Subsequently, as shown in FIG. 10B, a sacrificial insulation layer 312 is formed on the semiconductor substrate 310.

Herein, the sacrificial insulation layer 312 is formed by a material with a high etch selectivity ratio to the substrate 310, so that the sacrificial insulation layer 312 can be selectively removed during a subsequent etching process. For example, the sacrificial insulation layer 312 is formed by employing one selected from the group consisting of $SiO_2$, $Si_3N_4$, SiNH and a combination thereof. The sacrificial insulation layer 312 is formed by employing oxide, and a dry oxidation process or a wet oxidation process is employed to form the oxide-based sacrificial insulation layer 312. Also, the sacrificial insulation layer 312 is formed in a thickness ranging from approximately 50 Å to approximately 3000 Å.

Furthermore, a photoresist layer is formed on the above resulting substrate structure, and then a photo-exposure and developing process using a photo mask is performed to form a photoresist pattern 313 exposing the cell region A.

Next, impurities are implanted in the cell region A by performing an ion implantation process 314 using the photoresist pattern 313 as a barrier. Herein, the ion implantation process 314 utilizes ions for forming junction regions of the cell transistor. The implanted impurities serve as source/drain regions, that is, bit lines (BL) in the cell region A. For example, for an N-channel metal-oxide-semiconductor (NMOS) cell transistor, the ion implantation process 314 is performed at an ion implantation energy level ranging from approximately 5 KeV to approximately 50 KeV in a dose ranging from approximately $1 \times 10^4$ ions/$cm^2$ to approximately $1 \times 10^6$ ions/$cm^2$ using n-type impurities such as arsenic (As), phosphorus (P) or indium (In) which are materials of the group 5 in the periodic table. For a P-channel metal-oxide-semiconductor (PMOS) cell transistor, the ion implantation process 314 is performed at an ion implantation energy level ranging from approximately 5 Kev to approximately 50 KeV in a dose ranging from approximately $1 \times 10^4$ ion/$cm^2$ to approximately $1 \times 10^6$ ions/$cm^2$ using p-type impurities such as boron (B), boron difluoride ($BF_2$) or antimony (Sb) which are materials of the group 3 in the periodic table.

Moreover, as shown in FIG. 10C, a strip process is performed to remove the photoresist pattern 313.

Then, a mask process is performed to form another photoresist pattern 315 exposing predetermined portions of the cell region A. Herein, the regions exposed by the photoresist pattern 315 become channel regions.

Subsequently, an etching process using the photoresist pattern 315 as an etch barrier is performed to etch the sacrificial insulation layer 312 and the substrate 310. Thus, the substrate 310 is recessed in a uniform depth, forming a plurality of trenches 317. Herein, the trenches 317 are formed deeper than the depth of the impurity ions implanted by the ion implantation process 314 in FIG. 10B. This is to prevent electrical short-circuits between adjacent junction regions. Meanwhile, the trenches 317 become the channel regions of the cell transistor, and a plurality of the junction regions are defined by the trenches 317.

Meantime, by forming the channel regions deep at the trenches 317, decrease of the channel length can be prevented. Herein, the decrease of the channel length is caused by the ions in the junction regions diffusing into the channel regions during a subsequent thermal process. Conventionally, the junction regions and the channel regions are formed collinearly in horizontal direction, causing the ions of the junction regions to horizontally diffuse into the channel regions during a subsequent thermal process, resulting in decreased channel length. However, in the specific embodiment of the present invention, the channel regions are not formed collinearly with the junction regions, but formed with a certain height difference. Therefore, the channel length decrease due to the horizontal diffusion can be reduced during a subsequent thermal process. Even if the horizontal diffusion occurs, it is only trivial when compared with conventional methods, and so the channel length decrease can be minimized.

Both wet and dry etching methods can be employed in the etching process 316, and the dry etching method is advantageous for fine patterns. When the dry etching method is employed, a subsequent etching process for word lines (WL) and a gate structure can be performed easily by using taper etch.

Next, as shown in FIG. 10D, a strip process is performed to remove the photoresist pattern 315.

Then, the sacrificial insulation layer 312 is removed. Thus, predetermined portions of the substrate 310 are formed to protrude above portions of the channel regions. Meantime, if the sacrificial insulation layer 312 is formed by employing oxide, the sacrificial insulation layer 312 may remain on the substrate structure.

Furthermore, one of an oxidation process, an annealing process, and a combined process of a thermal diffusion process and an oxidation process is performed. Thus, junction regions 318 are formed, and at the same time, a gate oxide layer 319 is formed over the above resulting substrate structure. Because the impurities ions are implanted into the junction regions 318, the gate oxide layer 319 is formed thicker over the junction regions 318 when compared with other regions, i.e., the trenches 317 and the peripheral region B, as illustrated in FIG. 10D. The thickness of the gate oxide layer 319 is related to a concentration level of the impurities implanted onto the substrate 310, and as the concentration level becomes higher, the thickness of the gate oxide layer 319 increases. Although the gate oxide layer 319 is formed to have a uniform thickness in the cell region A and the peripheral region B in FIG. 10D for the convenience of description, the gate oxide layer 319 is actually formed the thickest over portions of the junction regions 318 in the cell region A. The height difference among the junction regions and the channel regions of the cell region A and the peripheral region B can be reduced by increasing a time for the annealing process or the thermal diffusion process to sufficiently diffuse the impurities. Meanwhile, the junction regions 318 function as the source/drain regions of the cell transistor and serve as bit lines (BL).

Subsequently, as shown in FIG. 10E, a polysilicon layer 320 is formed on the gate oxide layer 319. Herein, the polysilicon layer 320 is formed by employing one of an undoped polysilicon layer or a doped polysilicon layer. When the undoped polysilicon layer is used, the polysilicon layer 320 is formed by using $SiH_4$ or $Si_2H_6$ through a low pressure chemical vapor deposition (LPCVD) method. When the doped polysilicon layer is used, the polysilicon layer 320 is formed by using $SiH_4$ and $PH_3$, or $Si_2H_6$ and $PH_3$ through the LPCVD method. Meanwhile, the polysilicon layer 320 formed on the cell region A functions as the word lines (WL).

Furthermore, as shown in FIGS. 11A and 12A, the polysilicon layer 320 and the gate oxide layer 319 are etched to form a gate structure 321 in the peripheral region B.

At this time, as shown in FIG. 9, a plurality of separated word lines (WL) with a certain spacing distance are formed in the cell region A. Also, as shown in FIG. 12A, the gate oxide layer 319 is not completely removed, but portions of the gate oxide layer 319 remains on the lateral walls of the junction regions 318 as spacers. This non-complete removal is caused by the height difference of the protruded junction regions 318 during the etching process for forming the gate structure 321, resulting in the illustrated profile in FIG. 12A. Herein, the remaining portions of the gate oxide layer 319 are referred to as remaining gate oxide layers 319A.

Next, an LDD ion implantation process, which is a low-concentration ion implantation process, is performed to form lowly doped junction regions 322A and 322B in the exposed portions of the substrate 310 on both sides next to the gate structure 321.

Moreover, as shown in FIGS. 11B and 12B, an oxide layer, a nitride-based layer or a laminated layer of both is formed on the above resulting substrate structure illustrated in FIGS. 11A and 11B. Then, an etch-back process is performed to simultaneously form spacers 323A and 323B on lateral walls of the gate structure 321 and on lateral walls of the word lines (WL), respectively. Also, as shown in FIG. 12B, the spacers 323B are formed on the lateral walls of the remaining gate oxide layers 319A. As a result, double spacers of 319A and 323B are formed on the lateral walls of the junction regions 318 formed in the cell region A.

Furthermore, a source/drain ion implantation process, which is a high-concentration ion implantation process, is performed to form highly doped junction regions 324A and 324B in the lowly doped junction regions 322A and 322B exposed on both sides of the spacers 323A. Thus, source/drain regions 325A and 325B are formed. Herein, the highly doped junction regions 324A and 324B can be formed deeper than the lowly doped junction regions 322A and 322B.

Subsequently, as shown in FIGS. 11C and 12C, a nickel (Ni) layer, a titanium (Ti) layer, a tantalum (Ta) layer, a cobalt (Co) layer, a tantalum (Ta) layer or a laminated metal layer thereof is formed on the entire surface of the above resulting substrate structure including the source/drain regions 325A and 325B.

Then, a thermal process is performed to simultaneously form metal silicide layers 326B. In the cell region A, the metal silicide layers 326B are formed on the word lines (WL) and on the junction regions 318 and the substrate 310 between the double spacers 319A and 323B. At the same time, the metal silicide layer 326A is formed on the gate structure 321 and the source/drain regions 325A and 325B. At this time, the thermal process can be performed once or more depending on the material of the metal layer. For example, if titanium (Ti) and cobalt (Co) are used, the thermal process is performed twice, and if nickel (Ni) is used, the thermal process is performed once. Thus, a nickel silicide (NiSi) layer, a titanium silicide (TiSi$_2$) layer or a cobalt silicide (CoSi$_2$) layer is formed.

Subsequently, portions of the metal layer which did not react during the thermal process are removed.

As described above, the double spacers of 319A and 323B are formed on the lateral walls of the junction regions 318, and thus the metal silicide layers 326B do not form on the lateral walls of the junction regions 318. Therefore, electrical short-circuits caused by the metal silicide layers 326B do not occur between the adjacent junction regions 318. As a result, electrical short circuits between the bit lines (BL) do not occur, reducing deterioration of the device characteristics.

Furthermore, an inter-layer insulation layer 327 is formed on the above resulting substrate structure where the portions of the metal layer that did not react are removed. Then, a typical metal wiring process is performed to form metal wirings.

As described above, in accordance with the specific embodiment of the present invention, the electrical short-circuits between the adjacent junction regions can be reduced by: forming the double spacers on both lateral walls of the junction regions which function as the source/drain regions of the cell transistor; and performing the SALICIDE process to form the metal silicide layer only on the top portions of the word lines and the junction regions and prevent the formation of the metal silicide layer on the lateral walls of the junction regions. As a result, short-circuits between the bit lines can be prevented, and the deterioration of the device characteristics can be reduced.

Furthermore, by forming the double spacers on the lateral walls of the junction regions which function as the bit lines, using the conventional methods including the gate oxide layer formation method, the etching process, and the spacer formation process, the whole process can be simplified, and the metal silicide layers can be formed stably on every region of the chip, that are the word lines, the bit lines, the gate structure and the source/drain regions, including the cell region and the logic device region (also referred to as the peripheral region) in accordance with the specific embodiment of the present invention.

Moreover, according to the specific embodiment of the present invention, the channel regions of the cell transistor are not formed collinearly with the junction regions, but formed with a certain height difference by employing the trenches, and so the decrease in the channel length due to the horizontal diffusion of the ions is minimized in the subsequent thermal process. Thus, punch-throughs of the cell transistor induced by the decrease of the channel length and the threshold voltage reduction can be reduced, and the limitations such as electricity leak can be often resolved.

The present application contains subject matter related to the Korean patent application No. KR 2005-0028882, filed in the Korean Patent Office on Apr. 7, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, comprising:
   implanting impurities onto a substrate by performing an ion implantation process;
   recessing portions of the substrate to form a plurality of trenches;
   performing a first thermal process to form junction regions between the trenches in the substrate by diffusing the impurities and simultaneously to form a gate oxide layer on the substrate and on the junction regions;
   forming a polysilicon layer on the gate oxide layer;
   sequentially etching the polysilicon layer and the gate oxide layer to form a gate structure, and to form first spacers on lateral walls of the junction regions;
   forming second spacers on lateral walls of the first spacers and the gate structure; and
   forming a metal silicide layer on top portions of the junction regions and the gate structure.

2. The method of claim 1, wherein the junction regions are formed to protrude higher than channel regions formed at bottom portions of the trenches.

3. The method of claim 1, further comprising forming of a sacrificial insulation layer on the substrate before implanting the impurities.

4. The method of claim 3, wherein the sacrificial insulation layer includes a material with high etch selectivity ratio to the substrate.

5. The method of claim 4, wherein the sacrificial insulation layer includes employing one selected from the group consisting of $SiO_2$, $Si_3N_4$, SiNH and a combination thereof.

6. The method of claim 3, further comprising removing the sacrificial insulation layer after forming the trenches.

7. The method of claim 6, wherein the trenches are formed deeper than the depth of the implanted impurities.

8. The method of claims 6, wherein the first spacers are formed as a result that the gate oxide layer remains on the lateral walls of the junction regions due to a certain height difference between the junction regions and the substrate during the forming of the gate structure.

9. The method of claims 6, wherein the forming of the second spacers includes:
   forming an insulation layer on the substrate, the first spacers, and the gate structure; and
   performing an etch-back process.

10. The method of claims 6, wherein the first thermal process is performed employing one of an oxidation process, an annealing process and a combined process of thermal diffusion process and oxidation process.

11. The method of claims 6, wherein the forming of the metal silicide layer includes:
    forming a metal layer the substrate and the second spacers; and
    performing a second thermal process to cause the metal layer to react with the gate structure and the junction regions.

12. A method for fabricating a semiconductor device, comprising:
    preparing a substrate defined into a first region whereon a cell transistor is to be formed and a second region whereon a logic transistor is to be formed;
    implanting impurities onto the substrate in the first region by performing a first ion implantation process;
    recessing portions of the substrate in the first region to form a plurality of trenches;
    performing a thermal process to form bit lines between the plurality of trenches, and to form a gate oxide layer on the bit lines and the substrate;
    forming a polysilicon layer on the gate oxide layer;
    sequentially etching the polysilicon layer and the gate oxide layer to form word lines that cross the bit lines in the first region, to form a gate structure in the second region, and to form first spacers on both lateral walls of the bit lines;
    forming second spacers on the lateral walls of the first spacers and the gate structure;
    forming source/drain regions on exposed portions of the substrate surface on both sides of the gate structure by performing a second ion implantation process; and
    forming a metal silicide layer on the word lines, the bit lines, the gate structure and the source/drain regions.

13. The method of claim 12, wherein the bit lines are formed to be higher than channel regions formed at bottom portions of the trenches.

14. The method of claim 13, further comprising forming a sacrificial insulation layer on the substrate before implanting the impurities.

15. The method of claim 14, wherein the sacrificial insulation layer includes a material with high etch selectivity ratio to the substrate.

16. The method of claim 15, wherein the sacrificial insulation layer includes one selected from the group consisting of $SiO_2$, $Si_3N_4$, SiNH and a combination thereof.

17. The method of claim 14, further comprising removing the sacrificial insulation layer after forming the trenches.

18. The method of claim 17, wherein the trenches are formed deeper than the depth of the implanted impurities.

19. The method of claim 17, wherein the first spacers are formed as a result that the gate oxide layer remains on the lateral walls of the bit lines due to a certain height difference between the bit lines and the substrate during the formation of the gate structure.

* * * * *